(12) United States Patent
Tseng et al.

(10) Patent No.: US 7,867,908 B2
(45) Date of Patent: Jan. 11, 2011

(54) METHOD OF FABRICATING SUBSTRATE

(75) Inventors: Tzyy-Jang Tseng, Hsinchu (TW); Chih-Ming Chang, Tainan (TW); Cheng-Po Yu, Taoyuan County (TW); Chung W. Ho, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 12/422,428

(22) Filed: Apr. 13, 2009

(65) Prior Publication Data

US 2009/0197364 A1    Aug. 6, 2009

Related U.S. Application Data

(62) Division of application No. 11/128,769, filed on May 12, 2005, now Pat. No. 7,535,098.

(30) Foreign Application Priority Data

Jan. 3, 2005  (TW) ............................ 94100031 A

(51) Int. Cl.
*H01L 21/302* (2006.01)
(52) U.S. Cl. ............... 438/689; 438/690; 438/704; 438/706; 438/717; 438/745; 257/E21.214

(58) Field of Classification Search ................ 438/443, 438/444, 698, 734, 738, 690, 704, 706, 717, 438/745; 136/201, 203; 361/687, 704
See application file for complete search history.

(56) References Cited

U.S. PATENT DOCUMENTS

| | | | | |
|---|---|---|---|---|
| 4,871,418 A | * | 10/1989 | Wittlinger et al. | 438/106 |
| 5,712,448 A | * | 1/1998 | Vandersande et al. | 136/203 |
| 6,121,539 A | * | 9/2000 | Johnson et al. | 136/203 |
| 6,599,768 B1 | * | 7/2003 | Chen | 438/22 |

* cited by examiner

*Primary Examiner*—Wai-Sing Louie
(74) *Attorney, Agent, or Firm*—J.C. Patents

(57) ABSTRACT

A method of fabricating a substrate includes following steps. First, a metallic panel having a first surface and a second surface is provided. A first half-etching process is carried out to etch the first surface of the metallic panel to a first depth so that a first patterned metallic layer is formed on the first surface. Next, a first insulating material is deposited into gaps in the first patterned metallic layer to form a first insulator. Thereafter, a second half-etching process is carried out to etch the second surface of the metallic panel to a second depth and expose at least a portion of the first insulator so that a second patterned metallic layer is formed on the second surface. The first depth and the second depth together equal the thickness of the metallic panel.

15 Claims, 6 Drawing Sheets

METHOD OF FABRICATING SUBSTRATE

CROSS-REFERENCE TO RELATED APPLICATION

This application is a divisional of and claims priority benefit of an application Ser. No. 11/128,769, filed on May 12, 2005, now allowed, which claims the priority benefit of Taiwan application serial no. 94100031, filed on Jan. 3, 2005. The entirety of each of the above-mentioned patent applications is hereby incorporated by reference herein and made a part of this specification.

BACKGROUND OF THE INVENTION

1. Field of the Invention

The present invention relates to a substrate and a method of fabricating the same. More particularly, the present invention relates to a substrate having an improved thermal and electrical conductivity and a method of fabricating the same.

2. Description of the Related Art

The roles played by information products in this highly commercialized society are increasingly important. With the rapid development of information products, most electronic products have multiple functions and an increasingly miniaturized and streamlined body. Furthermore, the quality of the product is also increasingly stable. However, with the miniaturization of products, an efficient method of dissipating heat away from a high-power chip such as a power chip or a light-emitting diode and hence stabilizing its operation has become a dominant issue in the design of electronic products. For a package structure having a chip disposed on a substrate, the substrate constitutes one of the pathways for dissipating heat away from the chip and thus plays a critical role in the performance of the device. In other words, the heat-dissipating capacity of the substrate will directly influence the reliability of chip operation.

FIG. 1 is a schematic cross-sectional view of a conventional package structure having a substrate with good thermal conductivity. As shown in FIG. 1, the substrate 110 includes a patterned circuit layer 112, an insulating layer 114 and a metallic panel 116. The insulating layer 114 is located between the patterned circuit layer 112 and the metallic panel 116. A heat source 120 (a heat-generating device) is connected to a plurality of leads 130 that are bonded to the patterned circuit layer 112 on the substrate 110 through a soldering material 140. Any heat generated by the heat source 120 can be dissipated through the solder material 140, the patterned circuit layer 112, the insulating layer 114 and the metallic panel 116 as indicated by the arrow 150. Alternatively, heat from the heat source 120 can be dissipated through the leads 130, the solder material 140, the patterned circuit layer 112, the insulating layer 114 and the metallic panel 116 as indicated by the arrow 160.

In general, the insulating material 114 is fabricated using a substance including Fr-4, BT, Polyimide and PET, for example. Typically, these materials have a coefficient of thermal conductivity smaller than 1 W/m·° K. Even the improved thermally conductive PP has a coefficient of thermal conductivity smaller than 10 W/m·° K. Since the insulating layer 114 has such a low thermal conductivity and both heat-dissipating pathway 150 and 160 need to go through the insulating layer 114, the heat-dissipating efficiency of the respective heat-dissipating pathways 150 and 160 are not fully optimized. Because the heat-dissipating pathways can hardly provide the heat-dissipating rate demanded by the heat source 120, the performance and life of the heat source 120 will be adversely affected.

In addition, the patterned circuit layer 112 has a small cross-sectional area perpendicular to the current flow direction so that a higher resistivity is encountered. Hence, a high performance electrical transmission in the current flow direction is prevented.

SUMMARY OF THE INVENTION

Accordingly, the present invention is directed to a substrate having a higher thermal conductivity and electrical conductivity.

The present invention is further directed to a method capable of fabricating a substrate having a higher thermal conductivity as well as electrical conductivity.

To achieve these and other advantages and in accordance with the purpose of the invention, as embodied and broadly described herein, the invention provides a substrate. The substrate includes a metallic panel, a first insulator, and a second insulator. The metallic panel comprises a first patterned metallic layer and a second patterned metallic layer. The pattern in the first patterned metallic layer is different from the pattern in the second patterned metallic layer. Furthermore, a portion of the patterns is connected to each other. The first patterned metallic layer and the second patterned metallic layer are formed together as a unit. The first insulator is disposed in the gaps of the first patterned metallic layer, and the second insulator is disposed in the gaps within the second patterned metallic layer.

The present invention also provides a method of fabricating a substrate including the following steps. First, a metallic panel having a first surface and a second surface is provided. A first half-etching process is carried out at the first surface to etch the first surface of the metallic panel to a first depth so that a first patterned metallic layer is formed on the first surface. Next, a first insulating material is deposited into the gaps in the first patterned metallic layer to form a first insulator. Thereafter, a second half-etching process is carried out at the second surface to etch the second surface of the metallic panel to a second depth and expose at least a portion of the first insulator so that a second patterned metallic layer is formed on the second surface. The first depth and the second depth together equal the thickness of the metallic panel. A second insulating material is then deposited into the gaps in the second patterned metallic layer to form a second insulator.

The present invention also provides another method for fabricating a substrate including the following steps. First, a metallic substrate is provided. At least a via is formed to pass through the metallic substrate such that the via is disposed in the metallic substrate. Then, insulating material is deposited inside the via to form an insulator. Thereafter, a portion of areas of the metallic substrate is removed so that these metallic portions are detached from each other.

According to the aforementioned techniques, the present invention includes at least the following advantages. Firstly, because the conductive pathways between the top surface and the bottom surface of the substrate do not include any high thermal resistant insulating layer but include only through two mutually connected patterned metallic layers in the metallic panel, the substrate has a high heat-dissipating capacity. Secondly, because a portion of the patterned metallic layers is directly connected with each other and the cross-sectional area of the metallic circuit perpendicular to the current flowing direction is rather large, the resistivity of the transmission pathways can be reduced. Hence, a higher electrical transmission performance can be attained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
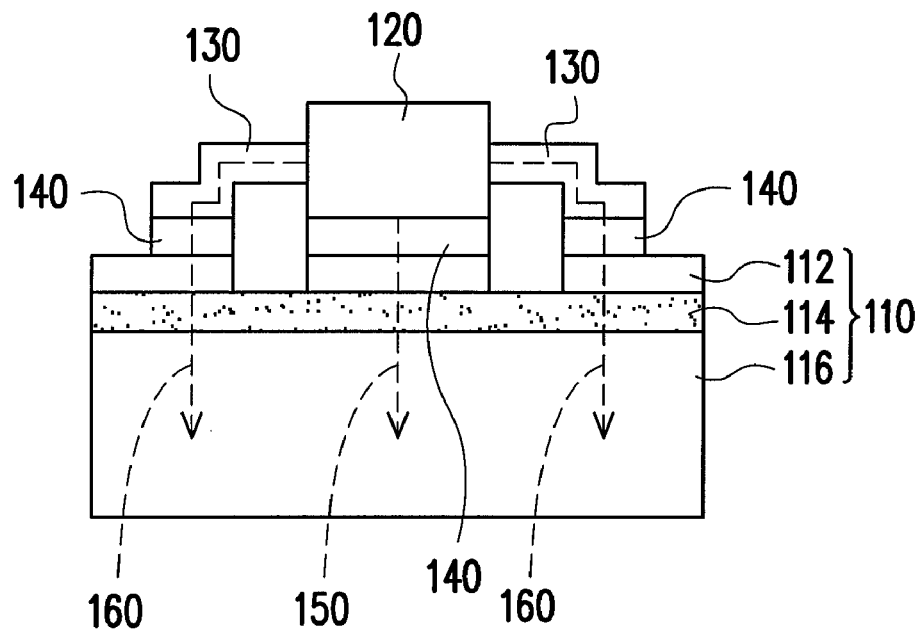
FIG. 1 is a schematic cross-sectional view of a conventional package structure having a substrate with good thermal conductivity.

Reference will now be made in detail to the present embodiments of the invention, examples of which are illustrated in the accompanying drawings. Wherever possible, the same reference numbers are used in the drawings and the description to refer to the same or like parts.

Figure 2:
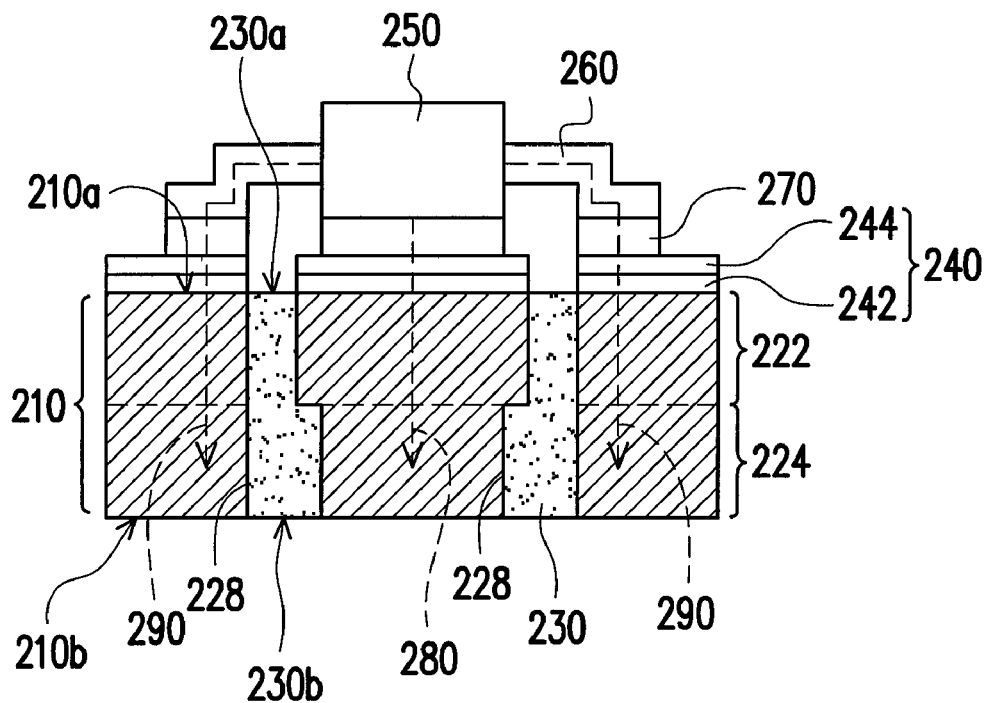
FIG. 2 is a schematic cross-sectional view of a package structure having a substrate according to the present invention.

FIG. 2 is a schematic cross-sectional view of a package structure having a substrate according to the present invention. As shown in FIG. 2, the substrate includes a metallic panel 210 and an insulator 230. The metallic panel 210 comprises two patterned metallic layers 222 and 224. The metallic panel 210 has a thickness between about 0.25 mm and 3.0 mm, which is equal to the total thickness of the patterned metallic layer 222 and the patterned metallic layer 224. The two opposing surfaces 210a and 210b of the metallic panel 210 define the top surface and the bottom surface of the substrate while the patterned metallic layers 222 and 224 are disposed on one side of the top surface 210a and the bottom surface 210b. The patterned metallic layers 222 and 224 together constitute the metallic panel 210. It should be noted that the heat-dissipation pathways 280 and 290 between the top surface 210a and the bottom surface 210b is provided through a solid connection of the patterned metallic layer. Consequently, the substrate of the present invention has a superior thermal conductive capacity.

Metallic layers can be selectively formed on the top surface 210a of the metallic panel 210, or in other words, on the surface of the patterned metallic layer 222. The metallic layer 240 is suitable for joining with a heat source 250. The heat source 250 is the package body of a high-power chip or a light-emitting diode, for example. In general, the chip is fabricated from a material such as silicon, gallium arsenide (GaAs) or germanium (Ge). The metallic panel 210 is made from copper, aluminum or stainless steel, for example. The metallic layer 240 comprises a nickel film 242 and a gold film 244. The nickel film 242 is disposed on the patterned metallic layer 222 while the gold film 244 is disposed on the nickel layer 242. The heat source 250 is suitable for joining with the gold film 244.

There are a number of gaps 228 between the patterned metallic layer 222 and 224 such that insulators fill up the gaps 228. In the present embodiment, the top surface 230a of the insulators 230 are coplanar with the top surface 210a of the patterned metallic layer 222 and the bottom surface 230b of the insulators 230 are coplanar to the patterned metallic layer 224. If the substrate of the present invention is used in a light-emitting diode package structure, the insulators 230 are preferably fabricated using a material having a highly reflective color such as white to increase the light emission efficiency of the light-emitting diode.

The heat source 250 may be connected with a plurality of leads 260. The heat source 250 and the leads 260 can be bonded to the metallic layer 240 on the substrate using a soldering material 270 such as solder paste. The heat generated by the heat source 250 can be dissipated away through the soldering material 270, the metallic layer 240, the patterned metallic layer 222 and the patterned metallic layer 224 shown by the heat-dissipating pathway 280 in FIG. 2. Alternatively, the heat can be dissipated away from the heat source 250 via the leads 260, the soldering material 270, the metallic layer 240, the patterned metallic layer 222 and the patterned metallic layer 224 shown by the heat-dissipating pathway 290 in FIG. 2.

Since the aforementioned heat-dissipating pathways 280 and 290 are formed purely from metallic materials without incorporating any heat resistant insulating layer, the heat-dissipating pathways 280 and 290 can provide a higher heat dissipating capacity. Thus, the substrate of the present invention can meet the higher heat dissipating capacity demanded from a high-power heat source 250. Furthermore, due to the design of the substrate, the patterned metallic layers 222 and 224 not only serve as a heat-dissipating pathway, but also serve as an electrical pathway for conducting an electric current to an external device. Since the two patterned metallic layers 222 and 224 are directed connected with each other instead of connecting through a high resistant via, overall resistant is reduced so high performance electrical transmission is provided.

In addition, the substrate of the present invention can be electrically connected with the chip directly through various means without going through a packaging procedure such as a flip-chip bonding or a wire bonding method. Obviously, a subsequent package encapsulation process may still be carried out after the chip and the substrate has been joined together.

Figure 3:
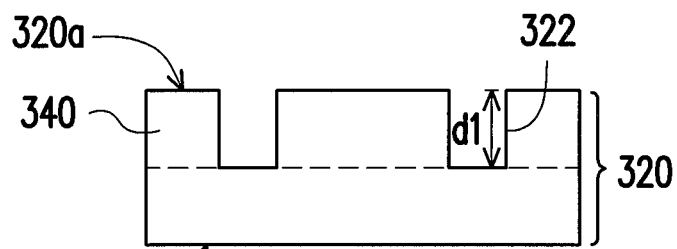
FIGS. 3 through 7 are schematic cross-sectional views showing the process of fabricating a substrate according to a first embodiment of the present invention.

FIGS. 3 through 7 are schematic cross-sectional views showing the process of fabricating a substrate according to a first embodiment of the present invention. As shown in FIG. 3, a metal panel 320 having a top surface 320a and a bottom surface 320b is provided. Then, a first half-etching process is performed to etch the top surface 320a of the metallic panel 320 to a first depth d1 and form a patterned metallic layer 340 on the top surface 320a. The first half-etching process includes the following steps. First, a photoresist layer (not shown) is formed on the top surface 320a and the bottom surface 320b. Thereafter, a photo-exposure and development process of the photoresist layer on the top surface 320a is carried out to pattern the photoresist layer and expose a portion of the top surface 320a. Using the photoresist layer as a mask, the exposed metallic panel 320 on the top surface 320a is etched to a first depth d1 to form a patterned metallic layer 340 such that gaps 322 are formed between the traces in the patterned metallic layer. Finally, the photoresist layer is removed.

Figure 4:
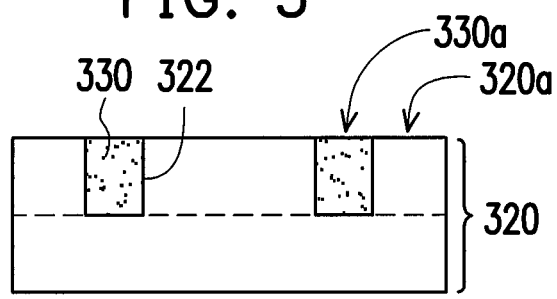

As shown in FIG. 4, a liquid polymer fills the gaps 322 to form an insulator 330. After performing a thermal treatment, the insulator 330 is cured. Then, a polishing operation is carried out to polish the top surface 320a of the metallic panel 320 and remove any protruding insulator 330 above the gaps 322 until the top surface 330a of the insulator 330 is coplanar with the top surface 320a of the metallic panel 320. However, the present invention is not limited as such. The step of polishing the top surface 320a of the metallic panel 320 can be skipped.

Figure 5:
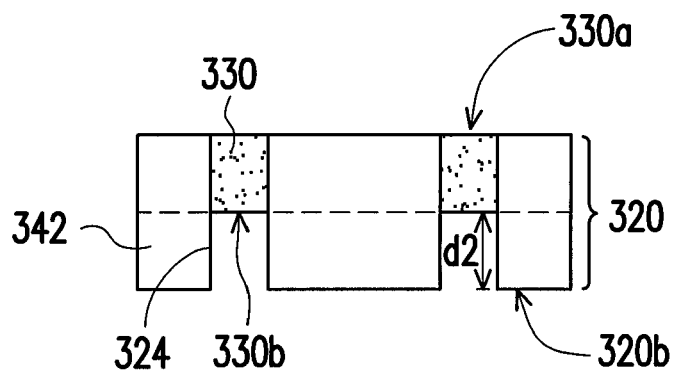

As shown in FIG. 5, a second half-etching process is performed to etch the second surface 320b of the metallic panel 320 to a second depth d2 and expose at least a portion of the bottom surface 330b of the insulator 330. Hence, a patterned metallic layer 342 is formed on the bottom surface 320b. The first depth d1 and the second depth d2 together equal the thickness of the metallic panel 320. In other words, the patterned metallic layers 340 and 342 together form an integrative metallic panel 320. The second half-etching process includes the following steps. First, a photoresist layer (not shown) is formed on the top surface 320a and the bottom surface 320b. Thereafter, a photo-exposure and development process of the photoresist layer on the bottom surface 320b is carried out to pattern the photoresist layer and expose a portion of the bottom surface 320b. Using the photoresist layer as a mask, the exposed metallic panel 320 on the bottom surface 320b is etched to a second depth d2 to form a patterned metallic layer 342 such that gaps 324 are formed between the traces in the patterned metallic layer. Finally, the photoresist layer is removed.

Figure 6:
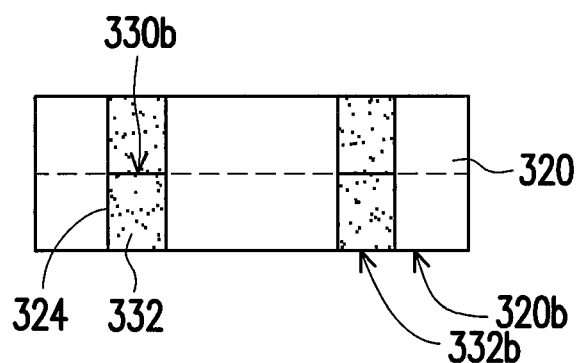

As shown in FIG. 6, a liquid polymer selectively fills the gaps 324 to form another insulator 332. After performing a thermal treatment, the insulator 332 is cured. Then, a polishing operation can be carried out to polish the bottom surface 320b of the metallic panel 320 and remove any protruding insulator 332 above the gaps 324 until the bottom surface 332b of the insulator 332 is coplanar with the bottom surface 320b of the metallic panel 320. However, the present invention is not limited as such. The step of polishing the bottom surface 320b of the metallic panel 320 can be skipped. In addition, the step of filling the gaps 324 to form the insulator 332 is optional. In other words, the gaps 324 can remain as it is without any fillings.

Figure 7:
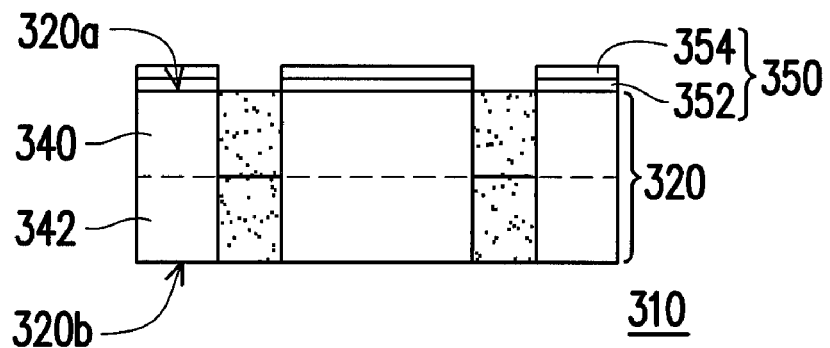

As shown in FIG. 7, a metallic layer 350 is plated on the top surface 320a of the patterned metallic layer 340 by selection. The plating process includes forming a nickel film 352 on the top surface 320a of the metallic panel 320 and then forming a gold film 354 over the nickel film 352. However, the application of the present invention is not limited as such. A composite metallic layer (not shown), comprising a nickel film and a gold film, may also form on the bottom surface 320b of the patterned metallic layer 342. Alternatively, the step of forming the metallic layer 350 on the top surface 320a of the patterned metallic layer 340 can be skipped so that the metallic layer is formed on the bottom surface 320b of the patterned metallic layer 342 only.

The aforementioned patterned metallic layers 340 and 342 may comprise a plurality of substrate circuit units. Thereafter, a singulation process may be carried out to separate these individual substrate circuit units so that the substrate 310 is cut up into a plurality of substrate units each suitable for packaging.

In the aforementioned process, the step for forming a soldering mask layer is not described. Obvious, a soldering mask layer (not shown) with openings may form on the top surface and the bottom surface of the substrate. The openings in the soldering mask layer may expose the patterned metallic layers 340 and 342 for forming a chip pad, contacts or a heat-dissipating section of the substrate 310.

Figure 8:
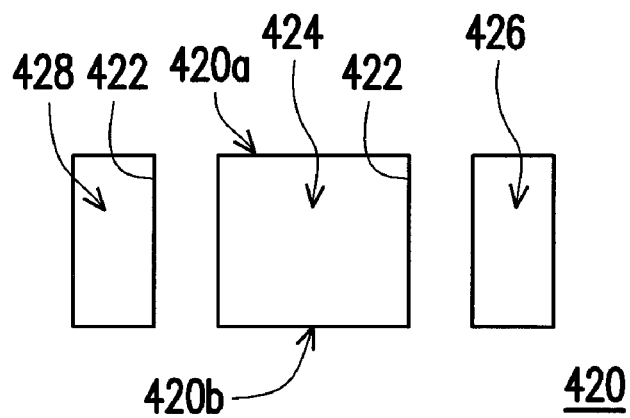
FIGS. 8 through 10 are schematic cross-sectional views showing the process of fabricating a substrate according to a second embodiment of the present invention.
Figure 8A:
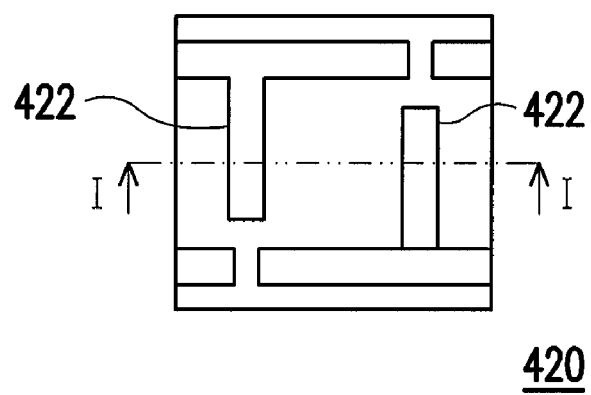
FIGS. 8A, 9A and 10A are the top views of FIGS. 8, 9 and 10 in the process of fabricating a substrate.
Figure 9:
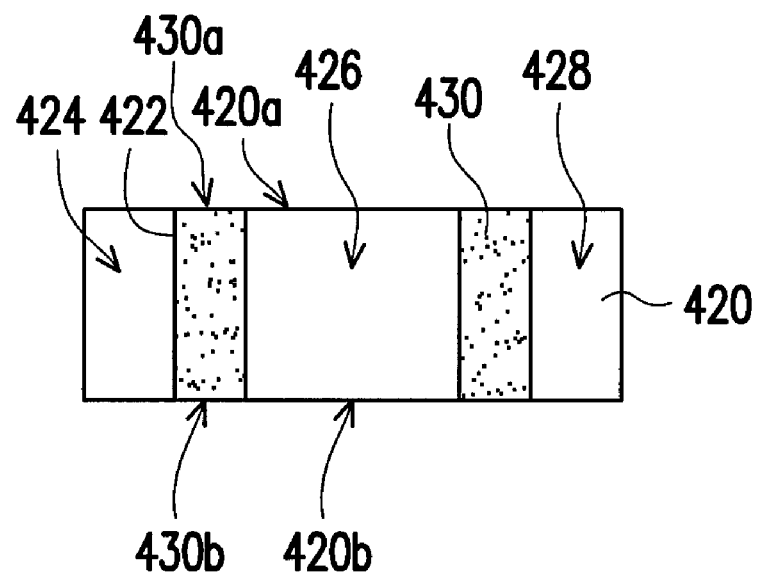
Figure 9A:
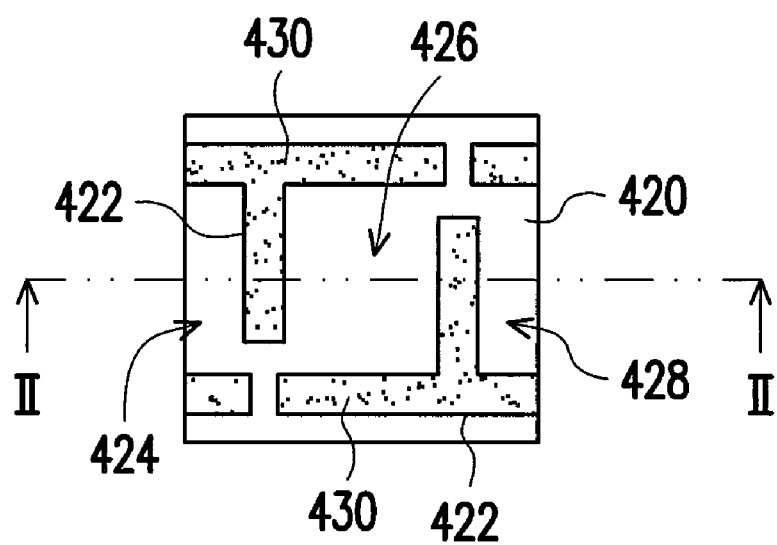
Figure 10:
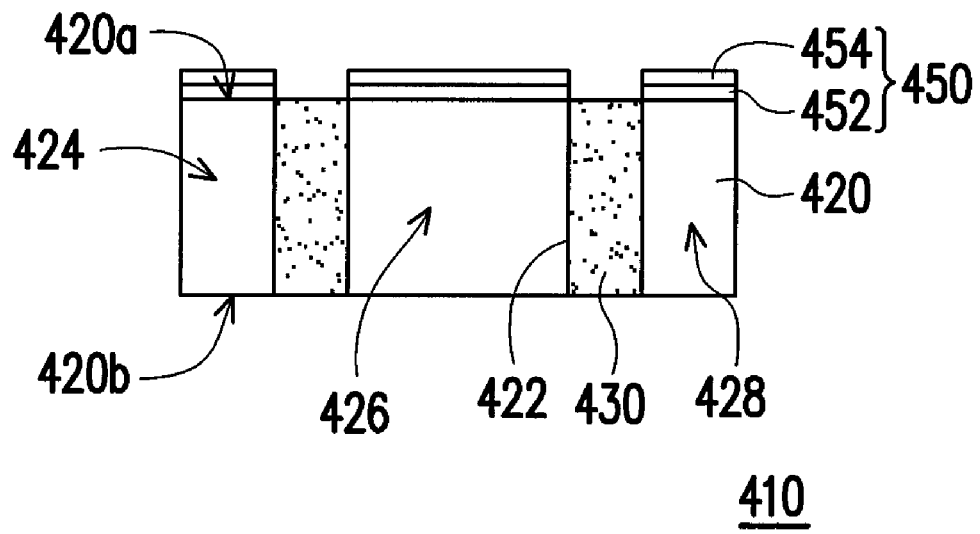
Figure 10A:
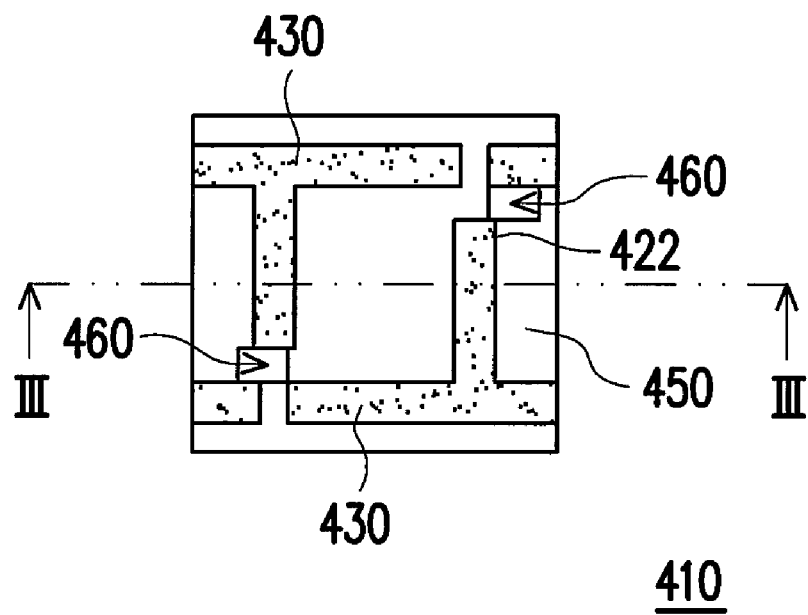

FIGS. 8 through 10 are schematic cross-sectional views showing the process of fabricating a substrate according to a second embodiment of the present invention. FIGS. 8A, 9A and 10A are the top views of FIGS. 8, 9 and 10 in the process of fabricating a substrate. In fact, FIG. 8 is a cross-sectional view along line I-I of FIG. 8A, FIG. 9 is a cross-sectional view along line II-II of FIG. 9A and FIG. 10 is a cross-sectional view along line III-III of FIG. 10A.

As shown in FIGS. 8 and 8A, a metallic substrate 420 is provided. Then, a mechanical punch process, for example, is used to punch a plurality of vias 422 passing through the metallic substrate 420.

As shown in FIGS. 9 and 9A, polymer is deposited into the vias 422 and then cured by heating to form insulators 430. Thereafter, a polishing operation is carried out to polish the top surface 420a of the metallic substrate 420 and remove any protruding insulators 430 outside the vias 422 so that the top surface 430a of the insulators 430 are coplanar with the top surface 420a of the metallic substrate 420. A polishing operation may be carried out to polish the bottom surface 420b of the metallic substrate 420 and remove any protruding insulators 430 outside the vias 422 so that the bottom surface 430b of the insulators 430 are coplanar with the bottom surface 420b of the metallic substrate 420. However, the applications of the present invention are not limited as such. The step of polishing the top surface 420a of the metallic substrate 420 or the step of polishing the bottom surface 420b can be skipped.

As shown in FIGS. 10 and 10A, a patterned metallic layer 450 is plated on the top surface 420a of the metallic substrate 420. The plating process includes forming a nickel film 452 on the top surface 420a of the metallic substrate 420 and then forming a gold film 454 over the nickel film 452. Other surface metallic films such as a chemically formed nickel and gold films may replace the plated nickel and gold films or a plated silver or chemically formed silver or soldering film may replace the plated nickel and gold films. In addition, the applications of the present invention are not limited as such. Another composite patterned metallic layer (not shown), comprising a nickel film and a gold film, may form on the bottom surface 420b of the metallic substrate 420. Alternatively, the step of forming a patterned metallic layer 450 on the top surface 420a of the metallic substrate 420 can be skipped. After that, a punching process can be carried out to remove some areas 460 of the metallic substrate 420 so that various metallic portions 424, 426, 428 can be detached from each other. Ultimately, the substrate is divided into a plurality of substrate units each suitable for packaging.

In the aforementioned process, the step of forming a soldering mask layer may be skipped. Obviously, a soldering mask layer (not shown) with openings may form on the top and bottom surface of the substrate 410. The openings in the soldering mask layer expose the patterned metallic layer 450 or the metallic substrate 420 for forming contacts or heat conductive connective portion of the substrate 410.

Figure 11:
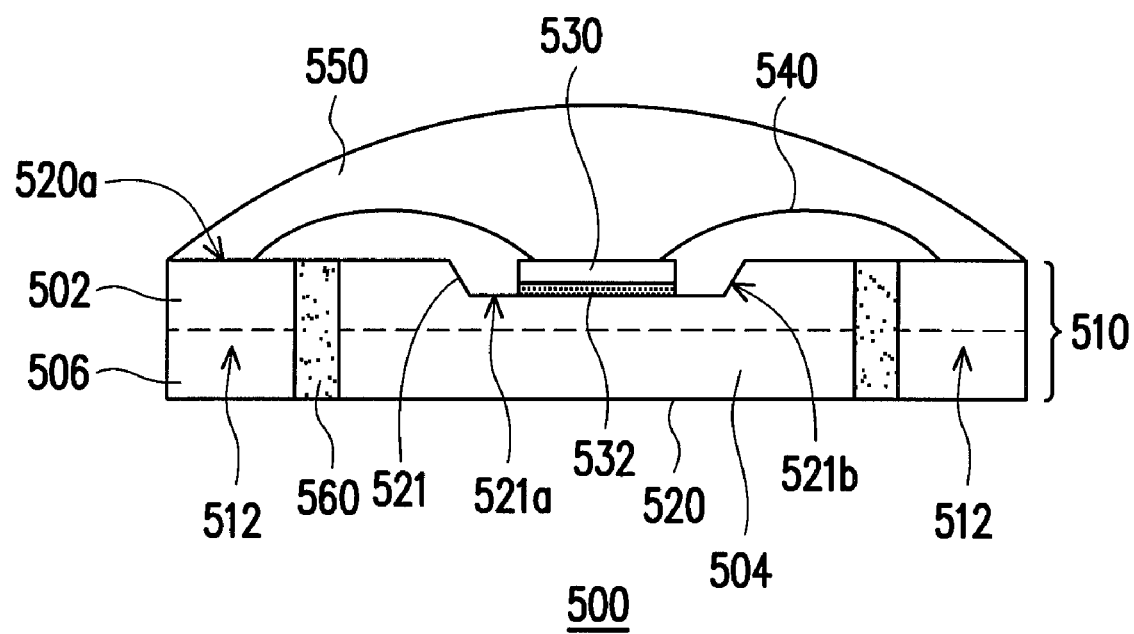
FIG. 11 is a schematic cross-sectional view of a light-emitting diode package structure according to one embodiment of the present invention.

FIG. 11 is a schematic cross-sectional view of a light-emitting diode package structure according to one embodiment of the present invention. As shown in FIG. 11, the metallic panel 520 has a recess cavity 521 below the top surface 520a of the metallic panel 520. The recess cavity 521 is capable of accommodating a light-emitting diode chip 530. To fabricate the light-emitting diode package 500, a punching process, a blind hole drilling process or an etching process, for example, is carried out to form the recess cavity 521 in the metallic panel 520. Thereafter, the processing steps according to the first embodiment or the second embodiment of the present invention are performed. Since the subsequent steps are similar to the aforementioned steps for forming the substrate, a detail description is omitted.

After forming the substrate 510 using the aforementioned processes, an adhesive material 532 is used to attach the light-emitting diode 530 onto the bottom section 521a of the recess cavity 521 in the metallic panel 520. Thereafter, a wire bonding operation is carried out to form a plurality of conductive wires 540 that connects the light-emitting diode 530 with the first contacts 502 of the leads 512 in the substrate 510. The first patterned metallic layer of the metallic panel 520 has a heat-dissipating part 504 and a plurality of second contacts 506 of the leads 512 such that the second contacts are electrically connected to corresponding first contacts 502 of the leads 512. Then, some packaging material 550 may be deposited over the substrate 510 to encapsulate the light-emitting diode 530 and the conductive wires 540.

Because the light-emitting diode chip 530 of the aforementioned light-emitting diode package 500 is disposed inside the recess cavity 521, light emitting from the light-emitting diode chip 530 will be reflected from the sidewalls 521b and bottom 521a of the recess cavity 520. Therefore, the light intensity in the forward direction will be increased. Furthermore, to increase the light-emitting performance of the light-emitting diode package 500, the insulator 560 can be fabricated using a material having a highly reflective color such as white or selected from a light color series.

In addition, the applications of the present invention is not limited as such. The light-emitting diode can be disposed on a planar metallic panel rather than inside a recess cavity.

In summary, the advantages of the present invention at least include:

1. The thermal conductive pathway between the top surface and the bottom surface of the substrate incorporates no heat resistant insulating material layer but metallic material only. Thus, the heat-dissipating capacity is significantly increased.

2. Because the patterned metallic layers are directly connected together, the cross-sectional area of the metallic circuit perpendicular to the current flow direction is quite large. Hence, electrical resistant can be reduced leading to a higher performance in electrical transmission.

3. The method according to the present invention can fabricate a substrate having a high heat-dissipating capacity and electrical conductivity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a substrate, comprising:
providing a metallic panel having a first surface and a second surface;
performing a first half-etching process to etch a region of the first surface of the metallic panel to a first depth and form a first patterned metallic layer on the first surface;
depositing a first insulating material into gaps within the first patterned metallic layer to form a first insulator; and
performing a second half-etching process to etch a region of the second surface of the metallic panel to a second depth and expose at least a portion of the first insulator such that a second patterned metallic layer is formed on the second surface, wherein a sum of the first depth and the second depth together equals a thickness of the metallic panel, wherein the first half-etching process and the second half-etching process just etch the regions of the first surface and the second surface without reducing the metallic panel in thickness.

2. The method of claim 1, wherein the first half-etching process further comprises:
forming a photoresist layer on the first surface and the second surface;
performing a photo-exposure and development process of the photoresist layer on the first surface to form a pattern photoresist layer that exposes a portion of the first surface;
performing an etching operation using the photoresist layer as a mask to etch the exposed metallic panel to a first depth and form the first patterned metallic layer; and
removing the photoresist layer.

3. The method of claim 1, wherein after filling the gaps within the first patterned metallic layer to form the first insulators, further comprises polishing the first surface and the first insulators.

4. The method of claim 1, wherein the second half-etching process comprises:
forming a photoresist layer over the first surface and the second surface;
performing a photo-exposure and development process of the photoresist layer on the second surface to form a pattern photoresist layer that exposes a portion of the second surface;
performing an etching operation using the photoresist layer as a mask to etch the exposed metallic panel to a second depth and form the second patterned metallic layer; and
removing the photoresist layer.

5. The method of claim 1, wherein the method further comprises filling the gaps within the second patterned metallic layer with second insulators.

6. The method of claim 5, wherein after filling the gaps within the second patterned metallic layer with second insulators, further comprises polishing the second surface and the second insulators.

7. The method of claim 1, wherein the method further comprises forming a metallic layer on the surface of the first patterned metallic layer and the second patterned metallic layer.

8. The method of claim 1, wherein the method further comprises forming a patterned solder mask layer on the surface of the first patterned metallic layer and the second patterned metallic layer such that a portion of the first patterned metallic layer and the second patterned metallic layer are exposed.

9. The method of claim 1, wherein the first patterned metallic layer and the second patterned metallic layer comprise a plurality of substrate circuit units and the substrate fabricating method further includes performing a singulation process to separate individual substrate circuit units.

10. A method of fabricating a substrate, comprising:
providing a metallic substrate;
forming at least a via that passes through the metallic substrate such that the at least a via is disposed in the metallic substrate;
depositing insulating material inside the at least a via to form an insulator; and
removing a portion of the metallic substrate at a region through the metallic substrate so that the metallic substrate is formed into a plurality of metallic portions detached from each other, wherein the step of removing the portion of the metallic substrate is just at the region without reducing the metallic substrate in thickness.

11. The method of claim 10, wherein the at least a via that passes through the metallic substrate are formed in a mechanical drilling process.

12. The method of claim 10, wherein the metallic substrate has a top surface such that the top surface of the metallic substrate and the insulators are polished after insulating material is deposited into the at least a via to form the insulator.

13. The method of claim 12, wherein the metallic substrate has a bottom surface on the other side of the top surface such that the bottom surface of the metallic substrate and the insulators are polished after insulating material is deposited into the at least a via to form the insulator.

14. The method of claim 10, wherein the metallic substrate has a top surface such that a patterned metallic layer is formed over the top surface of the metallic substrate after insulating material is deposited into the at least a via to form the insulator.

15. The method of claim 10, wherein before forming the at least a via in the metallic substrate, further includes forming a recess cavity in the metallic substrate for accommodating a light-emitting diode chip.

* * * * *